United States Patent [19]

Yagi

[11] Patent Number: 5,061,643
[45] Date of Patent: Oct. 29, 1991

[54] METHOD OF DOPING A GROWING CRYSTALLINE SEMICONDUCTOR FILM

[75] Inventor: Tetsuya Yagi, Itami, Japan

[73] Assignee: Mitsubishi Denki Kabushiki Kaisha, Japan

[21] Appl. No.: 457,525

[22] Filed: Dec. 27, 1989

[30] Foreign Application Priority Data

Mar. 30, 1989 [JP] Japan .................................. 1-80482

[51] Int. Cl.⁵ ............................................ H01L 21/20
[52] U.S. Cl. ....................................... 437/19; 437/81; 437/110; 437/936; 437/963; 437/971
[58] Field of Search ................... 148/DIG. 2, 4, 6, 22, 148/41, 90, 94, 95, 97, 110, 119, 154, 160, 169; 156/610–614; 427/248.1, 255.1, 53.1, 54.1; 437/19, 81, 82, 87, 94, 95, 105, 107, 110, 108, 111, 112, 126, 129, 133, 173, 247, 900, 935, 936, 942, 949, 963, 971

[56] References Cited

U.S. PATENT DOCUMENTS

| 4,657,777 | 4/1987 | Hirooka et al. | 427/39 |
| 4,748,132 | 5/1988 | Fukuzawa et al. | 437/173 |
| 4,772,486 | 9/1988 | Ishihara et al. | 437/173 |
| 4,778,692 | 10/1988 | Ishihara et al. | 427/53.1 |
| 4,782,035 | 11/1988 | Fujiwara | 437/173 |
| 4,843,029 | 6/1989 | Joyce et al. | 437/173 |
| 4,843,031 | 6/1989 | Ban et al. | 437/173 |
| 4,847,216 | 7/1989 | d'Avitaya et al. | 437/173 |
| 4,885,260 | 12/1989 | Ban et al. | 437/81 |
| 4,914,052 | 4/1990 | Kanai | 437/81 |
| 4,918,028 | 4/1990 | Shisai | 437/81 |
| 4,933,299 | 6/1990 | Durose | 437/173 |

FOREIGN PATENT DOCUMENTS 62-264619 11/1987 Japan .
63-28030 2/1988 Japan .

OTHER PUBLICATIONS

Duchemin et al., "A New Method . . . Organometallics", Journal of the Electrochemical Society, Jul. 1979, pp. 1134–1142.
Hallais et al., "Electrical and Optical . . . MO-VPE", Journal of Electronic Materials, vol. 10, No. 4, 1981, pp. 665–682.

Primary Examiner—Olik Chaudhuri
Assistant Examiner—William Bunch
Attorney, Agent, or Firm—Leydig, Voit & Mayer

[57] ABSTRACT

A method of growing a semiconductor thin film by MOCVD including doping with a doping gas producing a carrier concentration regulated by the decomposition speed of the doping gas, selectively irradiating the doping gas with ultraviolet light before the doping gas reaches the growing film, whereby the decomposition speed of the doping gas is increased.

13 Claims, 11 Drawing Sheets

METHOD OF DOPING A GROWING CRYSTALLINE SEMICONDUCTOR FILM

METHOD OF THE INVENTION

The present invention relates to a method of growing a crystalline semiconductor thin film and an apparatus therefor and, more particularly, to a metal organic chemical vapor deposition method.

BACKGROUND OF THE INVENTION

Figure 8:
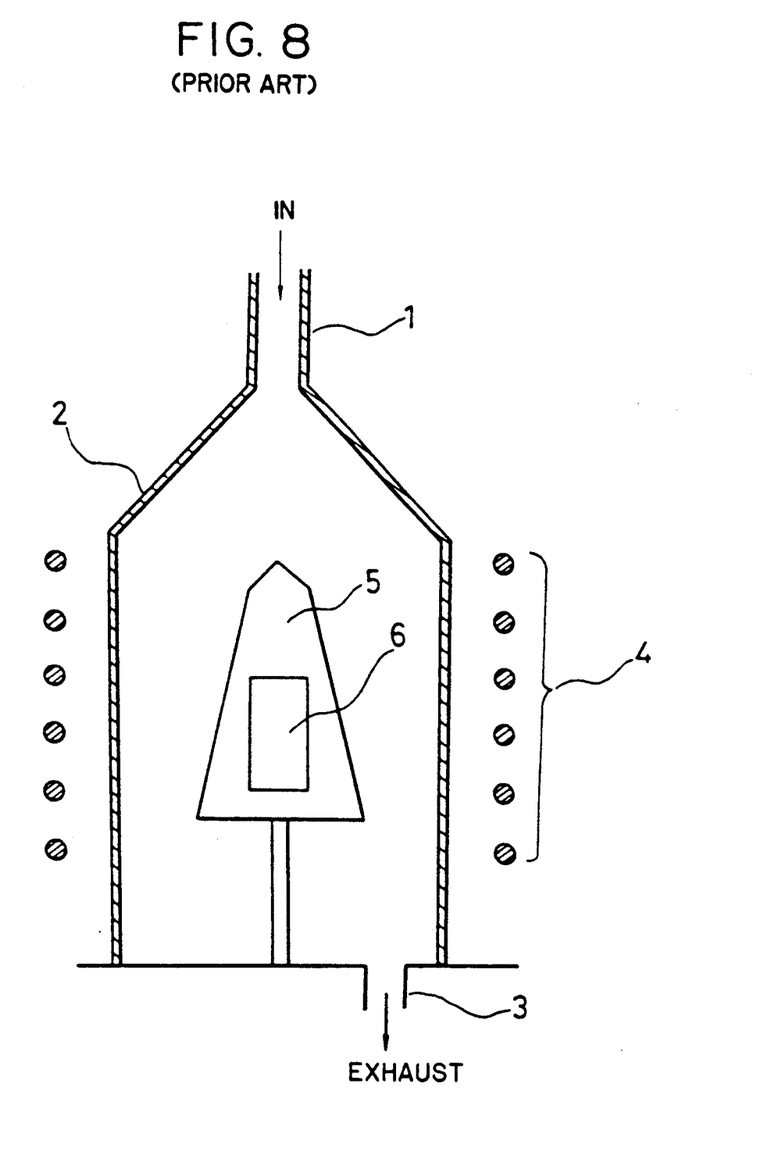
FIG. 8 is a diagram showing a cross-section of a prior art MOCVD apparatus.

FIG. 8 is a schematic view of the reaction tube of a prior art apparatus which is used for metal organic chemical vapor deposition (hereinafter referred to as "MOCVD"). In FIG. 8, reference numeral 2 designates a reaction tube made of quartz having a gas inlet 1 at the top portion thereof. An exhaust gas outlet 3 is provided at the bottom of reaction tube 2. Coils 4 for heating a carbon susceptor 5 with high frequency electromagnetic waves are disposed outside and surrounding the reaction tube 2. The carbon susceptor 5 is disposed inside the reaction tube 2. A wafer 6 is disposed on the susceptor 5.

A method of growing an AlGaAs epitaxy layer utilizing this prior art apparatus will be described.

When an AlGaAs layer is epitaxially grown, GaAs is generally used as a substrate, and trimethyl-gallium (TMGa), trimethyl-aluminum (TMAl), and arsine (AsH$_3$) are used as the source gases. Although there are various kinds of doping gases, hydrogen selenide (H$_2$Se) is generally used as a donor source and dimethyl-zinc (DMZn) or diethyl zinc (DEZn) is generally used as an acceptor source. These gases are introduced into the reaction tube 2 from the gas inlet 1 together with the hydrogen as a carrier gas. The gases introduced into the reaction tube 2 are decomposed at places on or near the GaAs substrate 6. An AlGaAs epitaxial layer is grown on the GaAs substrate 6 on the basis of the following reaction.

$$xTMAL + (1-x)TMGa + AsH_3 \rightarrow Al_xGa_{1-x}As + 3CH_4$$

The compisition of the mixed crystal film grown can be controlled by varying the composition ratio of source gases. The conductivity type and the carrier concentration of epitaxial layer can be controlled by mixing doping gases into the source gases. Since the above-described doping gases such as H$_2$Se, DMZn, or DEZn have quite a high decomposition speed at the growth temperature e.g., 600° to 750° C., employed in the ordinary MOCVD method, the carrier concentration of the doped epitaxy layer is regulated by the dopant supply rate. The carrier concentration of epitaxial layer can be controlled by the flow rate of the doping gas in the source and carrier gases. The upper limit is regulated by the dopant solubility in the epitaxial layer.

Figure 9:
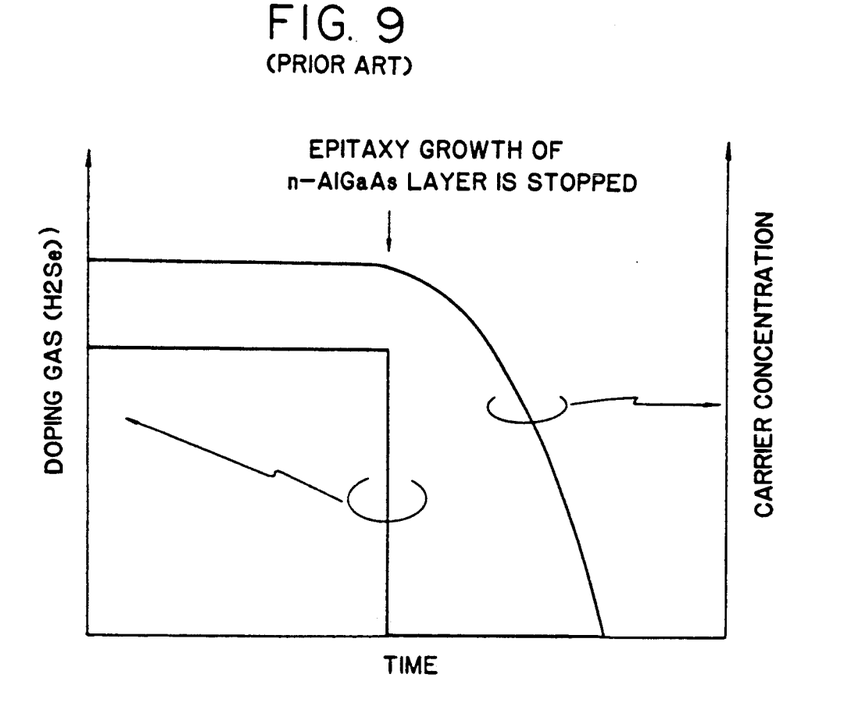
FIG. 9 is a diagram showing doping characteristics of selenium according to the prior art.

When an n type Al$_x$Ga$_{1-x}$As (hereinafter referred to as "n-Al$_x$Ga$_{1-x}$As") epitaxial layer is grown on the substrate and an undoped or a p type Al$_y$Ga$_{1-y}$As (hereinafter referred to as "p-Al$_y$Ga$_{1-y}$As") epitaxial layer is grown thereon using H$_2$Se as n type dopant in the apparatus of FIG. 8, the supply of H$_2$Se into reaction tube 2 is halted when the growth of the n-Al$_x$Ga$_{1-x}$As epitaxy layer concludes as shown in FIG. 9. Ideally, the introduction of Se into the epitaxial layer is completely ended at this stage, but, practically, H$_2$Se molecules which have attached to the internal wall of reaction tube or gas inlet tube remain. This results in the carrier concentration profile shown in FIG. 9. Such a phenomenon is called as "H$_2$Se memory effect".

The laser doubleheterojunction (hereinafter referred to as "DH") of FIG. 10 can be produced using H$_2$Se as an n type dopant as will be described below.

Figure 10:
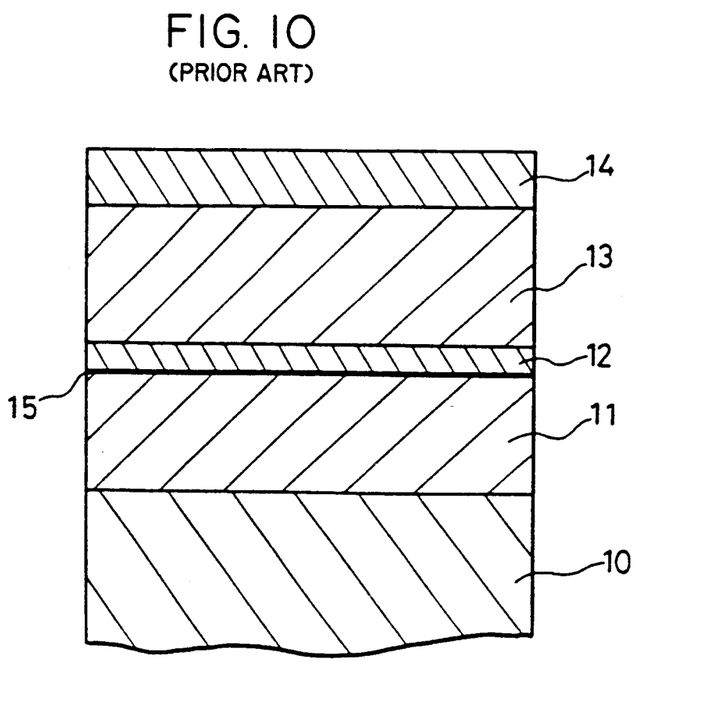
FIG. 10 is a diagram showing a cross-section of a semiconductor laser according to the present invention and the prior art.

In FIG. 10, reference numeral 10 designates an n-GaAs substrate. An n-Al$_x$Ga$_{1-x}$As first cladding layer 11 is grown on the substrate 10. A p-Al$_y$Ga$_{1-y}$As active layer 12 is grown on the first cladding layer 11. A p-Al$_x$Ga$_{1-x}$As second cladding layer 13 is grown on the active layer 12. A p-GaAs contact layer 14 is grown on the second cladding layer 13. A pn junction is produced between the n-Al$_x$Ga$_{1-x}$As first cladding layer 11 and the p-Al$_y$Ga$_{1-y}$As active layer 12. When this device is used for a CD laser, the n-Al$_x$Ga$_{1-x}$As first cladding layer 11 with x=0.5 having a film thickness of about 2.5 microns, the p-Al$_y$Ga$_{1-y}$As active layer 12 with y=0.15 having a film thickness of about 800 angstroms, the p-Al$_x$Ga$_{1-x}$As second cladding layer 13 with x=0.5 having a film thickness of about 1.2 microns, and the p-GaAs contact layer 14 having a film thickness of about 0.5 microns, are preferably employed.

Figure 11:
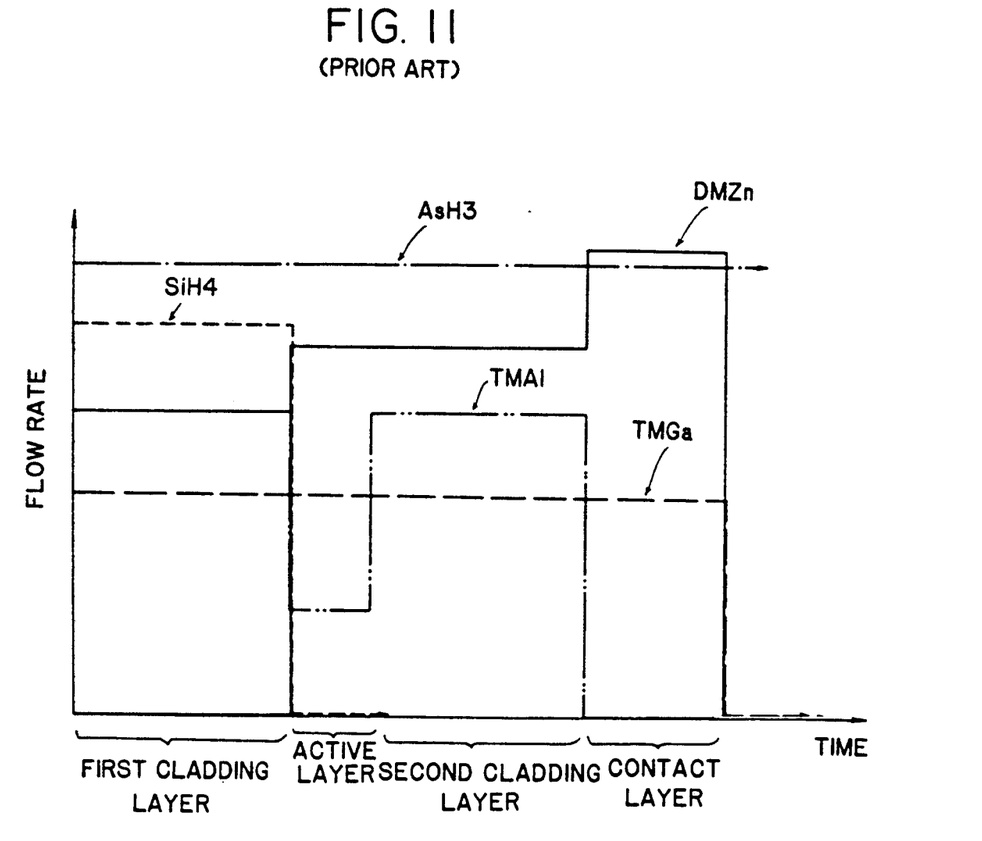
FIG. 11 is a diagram showing a growth program of semiconductor of FIG. 10 according to the prior art.
Figure 12:
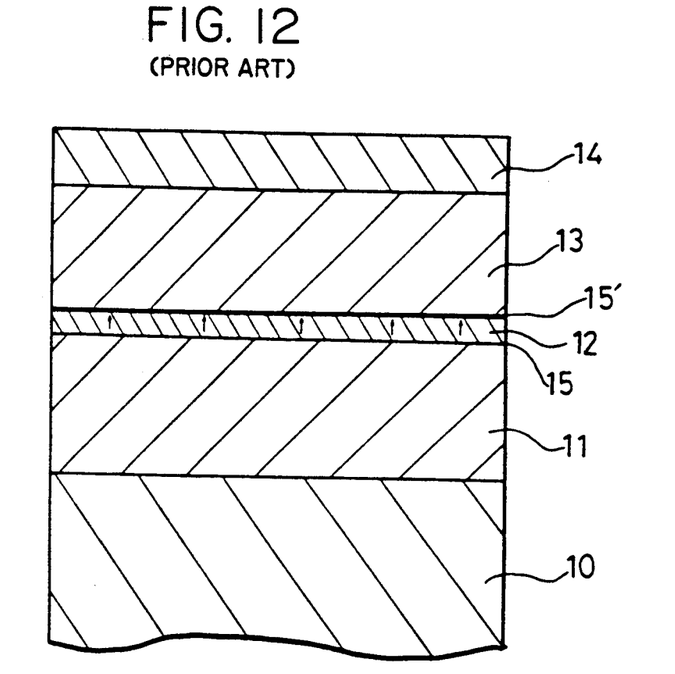
FIG. 12 is a diagram showing an example of a semiconductor laser with a remote junction according to the prior art.

FIG. 11 shows a growth program of the MOCVD method which for obtaining the DH shown in FIG. 10 in the prior art semiconductor thin film crystal growth apparatus shown in FIG. 8. As shown in FIG. 11, when the growth of n-Al$_x$Ga$_{1-x}$As first cladding layer 11 concludes, the supply of H$_2$Se is halted and the supply of DMZn is started. When such a growth program is used, the position of pn junction 15' often deviates from the presupposed position 15 toward the p-Al$_x$Ga$_{1-x}$As second cladding layer 13 due to the above-described H$_2$Se memory effect, as shown in FIG. 12. The width of positional deviation of the pn junction varies depending on the state of the apparatus, more concretely, the state of the internal walls of the reaction tube or of the gas inlet tube.

Figure 14A:
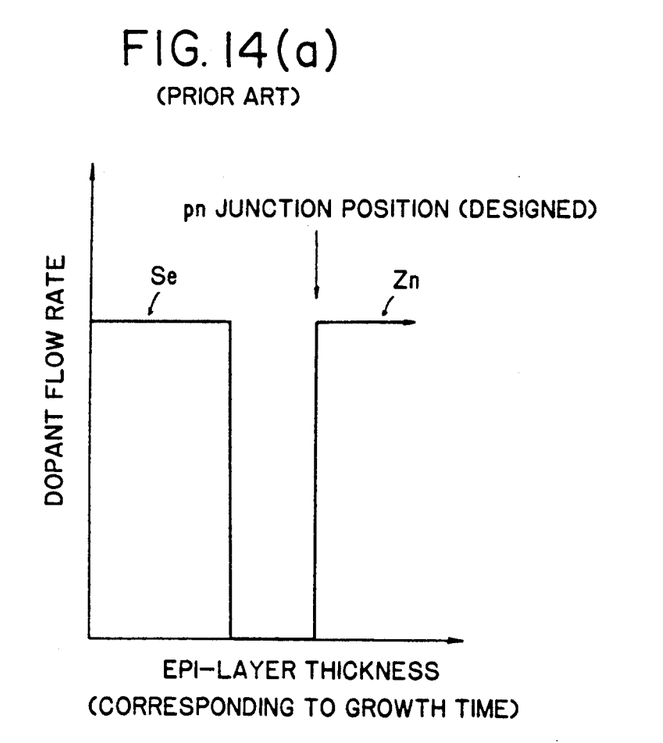
FIGS. 14(a), 14(b), and 14(c) are diagrams for explaining the causes of remote junctions according to the prior art.
Figure 14B:
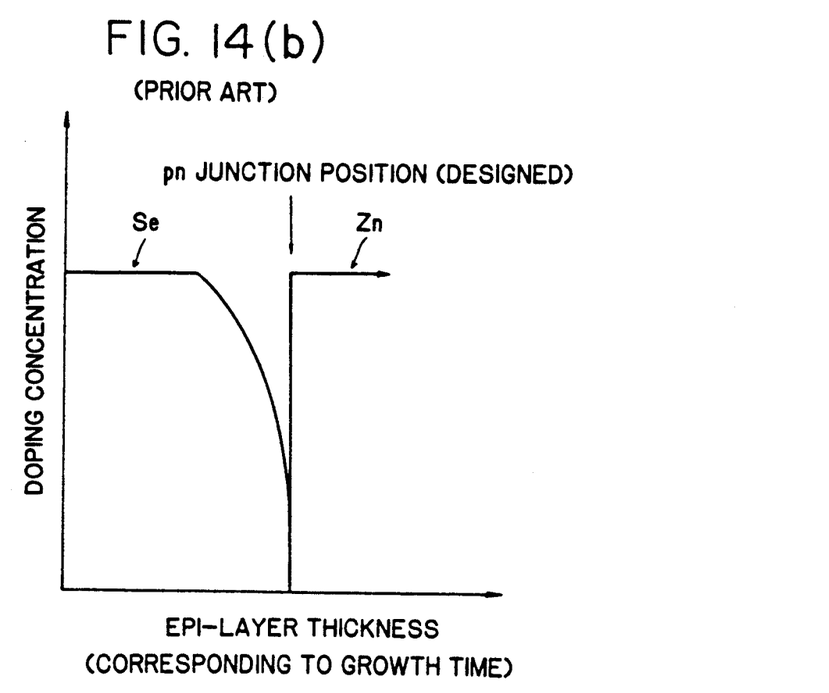
Figure 14C:
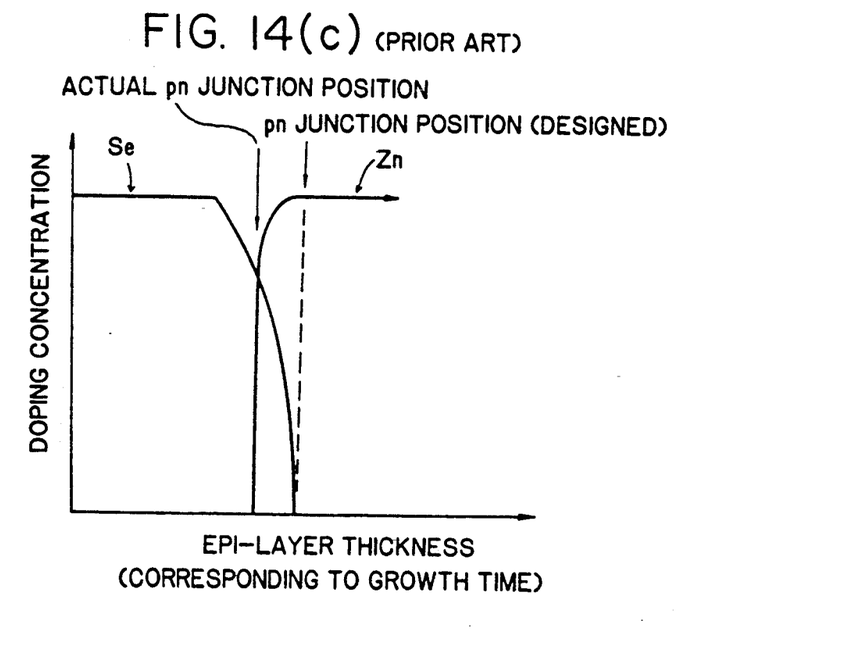

In order to prevent such a positional deviation of the pn junction, the supply of H$_2$Se is halted before Se reaches the design position of the pn junction as shown in FIG. 14(a). Then, the doping of Se concludes at the pn junction design position in view of the H$_2$Se memory effect, as shown in FIG. 14(b). In this method, however, when the wafer is at high temperature in a later thermal annealing process, Zn as the p type dopant for producing the p-Al$_y$Ga$_{1-y}$As active layer 12 diffuses to the n-Al$_x$Ga$_{1-x}$As first cladding layer 11 provided therebelow, and the actual pn junction position is deviated from the design position toward the first cladding layer 11. Particularly, since Zn is diffused with a steeper profile than the other dopant, control of the pn junction position is difficult. In case of a CD laser, because the active layer generally is rather thin, i.e., about 500 to 1000 angstroms thick, even when the pn junction position is slightly deviated from the design position (it is called as a "remote junction"), the laser characteristics deteriorate to a great extent.

Figure 13:
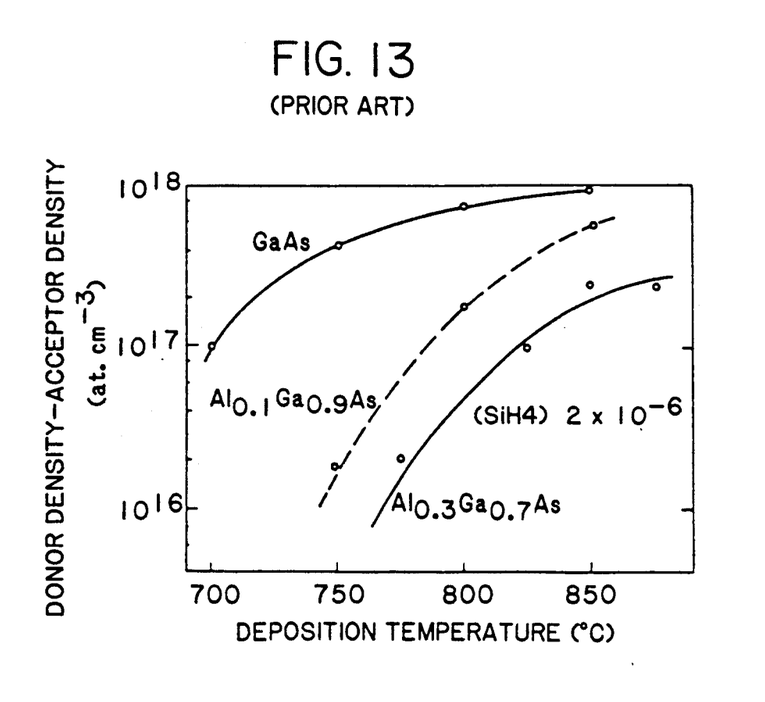
FIG. 13 is diagram showing a doping characteristics of SiH$_4$ according to the prior art.

In order to prevent remote junctions due to the H$_2$Se memory effect, a dopant source having a low memory effect is required. SiH$_4$ is well known as such a dopant source. However, as shown in FIG. 13, SiH$_4$ has the disadvantage of low doping efficiency at the usual MOCVD growth temperature of about 600° to 750° C. This is because the doping efficiency of SiH$_4$ is mainly regulated by its thermal decomposition speed. Since a dopant concentration of about $1 \times 10^{17}$ to $1 \times 10^{19}$ cm −3 is required to produce a semiconductor laser, it is difficult to produce an epitaxial layer for a semiconductor laser using SiH$_4$ as a dopant gas in MOCVD method.

Problems in the prior art semiconductor thin film crystal growth by MOCVD method and the apparatus therefor are summarized as follows.

(1) In a case where H$_2$Se is used as a dopant gas, when the supply of dopant gas into the reaction tube is halted, the doping of Se into epitaxy layer does not immediately stop. Therefore, a steep doping profile cannot be obtained. Furthermore, as is easily presumed from this fact, accurate control of the pn junction position is difficult.

(2) When SiH$_4$ having a low memory effect is used as the dopant gas, the doping efficiency is regulated by the thermal decomposition speed of SiH$_4$, and a high dopant concentration cannot be achieved at a practical crystal growth temperature.

SUMMARY OF THE INVENTION

It is an object of the present invention to provide a method of growing a crystalline semiconductor thin film by an MOCVD process producing a high dopant concentration using a dopant gas having a low memory effect, such as SiH$_4$, and obtaining a steep doping profile.

It is another object of the present invention to provide an apparatus for the growth method.

Other objects and advantages of the present invention will become apparent from the detailed description given hereafter; it should be understood, however, that the detailed description and specific embodiment are given by way of illustration only, since various changes and modifications within the spirit and scope of the invention will become apparent to those skilled in the art from this detailed description.

According to a first aspect of the present invention, while doping using a dopant source producing a carrier concentration regulated by decomposition speed only the dopant gas is irradiated with ultraviolet light before the dopant reaches a substrate or a transition layer produced on the substrate, whereby the speed at which the dopant gas is decomposed is increased. Therefore, a high dopant concentration can be realized.

According to a second aspect of the present invention, when only a dopant gas is irradiated with ultraviolet light before the dopant gas reaches the substrate or the transition layer disposed on the substrate, the intensity of the ultraviolet rays is controlled without varying the flow rate of dopant gas, thereby controlling the carrier concentration in the grown layer. Thus, not only a high dopant concentration is obtained by increasing the light intensity, but also a steep doping profile is obtained by varying the light intensity within a wide range.

According to a third aspect of the present invention, when only the dopant gas is irradiated by ultraviolet light before the dopant gas reaches the substrate or a transition layer disposed on the substrate, pulsed ultraviolet light having a constant peak intensity are employed, and the pulse width and the pulse frequency thereof are controlled without varying the flow rate of the dopant gas, thereby controlling the carrier concentration in the grown layer. A high dopant concentration is obtained while pulsed light is present, and a low dopant concentration is obtained while pulsed light is not present, thereby resulting in a steep doping profile.

Furthermore, by increasing the pulse frequency to a sufficiently high speed as compared with the decomposition speed of the dopant gas, the pulse duty can be varied, thereby controlling the doping profile.

According to a fourth aspect of the present invention, while a multi-layer semiconductor thin film including a pn junction is being grown by the MOCVD method, a doping at a region spaced from the pn junction, and at least at the n side of the junction, is carried out using a dopant gas producing a carrier concentration regulated by the flow rate of the dopant gas, and the doping in the neighborhood of pn junction is carried out using a dopant gas producing a carrier concentration regulated by the decomposition speed, and ultraviolet light before the dopant gas reaches the substrate or a transition layer disposed on the substrate. Thus, doping is carried out using a dopant having optical characteristics at a region other than in the neighborhood of pn junction, and doping is carried out using a dopant having a steep doping profile in the neighborhood of pn junction. Therefore, a semiconductor multi-layer thin film superior in optical characteristics and having no remote junction is obtained.

According to a fifth aspect of the present invention, an apparatus for growing a semiconductor thin film has a first gas inlet through which alkyl or hydride source gases and doping gases producing carrier concentrations regulated by flow rate and a carrier gas, such as hydrogen, are introduced into a reaction tube. A second gas inlet through which doping gases producing carrier concentrations regulated by decomposition speed are introduced into the reaction tube. The second gas inlet is made of a material transparent to ultraviolet rays, such as quartz. A plurality of convex portions, concave portions, or portions having different refractive indices are provided at the internal wall of second gas inlet so that ultraviolet rays escape from the inside of tube from those portions. Therefore, the dopant gases can be selectively irradiated with ultraviolet light to produce carrier concentrations regulated by decomposition speed before the dopant gas reaches the substrate or a transition layer produced on the substrate.

DETAILED DESCRIPTION OF THE PREFERRED EMBODIMENTS

A method of growing a crystalline semiconductor thin film according to a first embodiment of the present invention will be described as follows.

Herein, a case where an AlGaAs layer is epitaxially grown on a GaAs substrate will be described. The same materials, TMGa, TMAl, and AsH$_3$, as in the prior art method, are used. SiH$_4$ is used as a dopant which produces a carrier concentration regulated by its decomposition speed. When SiH$_4$ is used, a steep carrier profile can be obtained because the SiH$_4$ memory effect is smaller than that of H$_2$Se which has been formerly used. However, in the prior art doping method using SiH$_4$, the doping efficiency was low and achievement of a high dopant concentration was difficult. This is because the doping speed of SiH$_4$ is regulated by its thermal decomposition speed.

Figure 1:
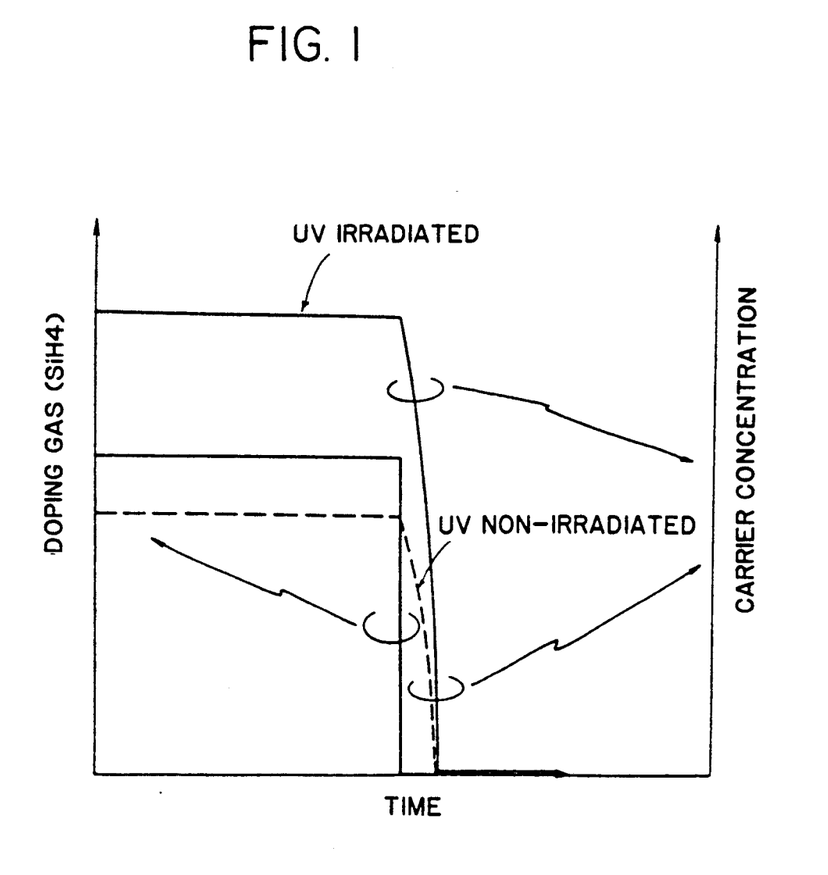
FIG. 1 is a diagram showing doping characteristics according to a first embodiment of the present invention.

In this embodiment the SiH$_4$ is irradiated with ultraviolet rays are irradiated to SiH$_4$ to increase the decomposition speed of the SiH$_4$. For example, when light from an excimer laser at a wavelength of 193 nm is irradiated on SiH$_4$, SiH$_4$ is excited and has a sufficiently high decomposition speed even at a low temperature of about 400° C. Accordingly, at a growth temperature of 600° to 750° C., as in the ordinary MOCVD method, SiH$_4$ irradiated with ultraviolet light acquires a sufficiently high thermal decomposition speed. Therefore, by increasing the amount of SiH$_4$ supplied, a high dopant concentration above $1 \times 10^{18}$ cm$^{-3}$, is realized. FIG. 1 shows difference in the carrier concentrations where ultraviolet light irradiates SiH$_4$ and where it does not. The flow rate of SiH$_4$ is the same in both cases.

Furthermore, in this crystal growth method, since ultraviolet rays selectively irradiate SiH$_4$, source gases such as TMGe, TMAl, and AsH$_3$ will not be excited by the ultraviolet rays. Therefore, it is possible to avoid variations in the composition ratio and the crystal growth speed due to variations in the decomposition speed due to irradiation of the source gases by ultraviolet rays.

Figure 2:
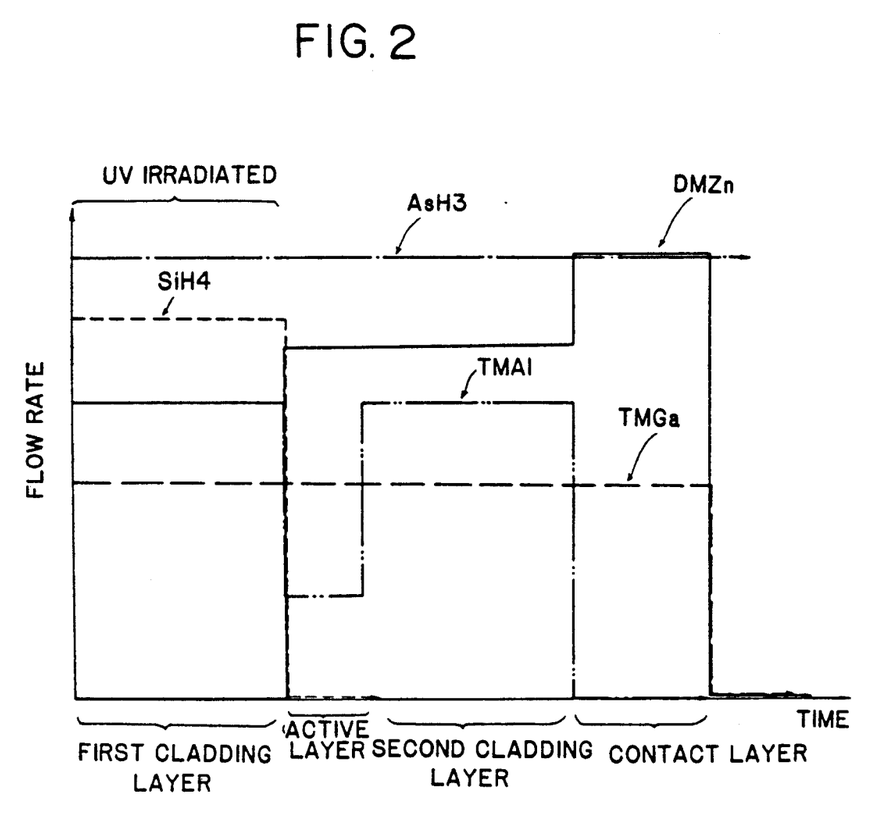
FIG. 2 is a diagram showing a growth program for a semiconductor laser of FIG. 10 according to the first embodiment.

The DH semiconductor laser of FIG. 10 can be produced by the method of this embodiment as will be described below. FIG. 2 shows a growth program for this example. While growing n-Al$_x$Ga$_{1-x}$As first cladding layer 11 on the n-GaAs substrate 10, SiH$_4$ is used as dopant and ultraviolet rays selectively irradiate only the SiH$_4$ in order to realize a high dopant concentration. The ultraviolet rays and supply of the SiH$_4$ are halted when growth of first cladding layer 11 concludes. In the DH produced by this method, since the SiH$_4$ memory effect is low, the pn junction position will not deviate from the design position toward the second cladding layer 13. Furthermore, since the decomposition speed of SiH$_4$ can be sufficiently increased by the ultraviolet rays, a high dopant concentration of about $1 \times 10^{18}$ cm$^{-3}$, which is necessary for producing the DH laser, can be realized.

Figure 3:
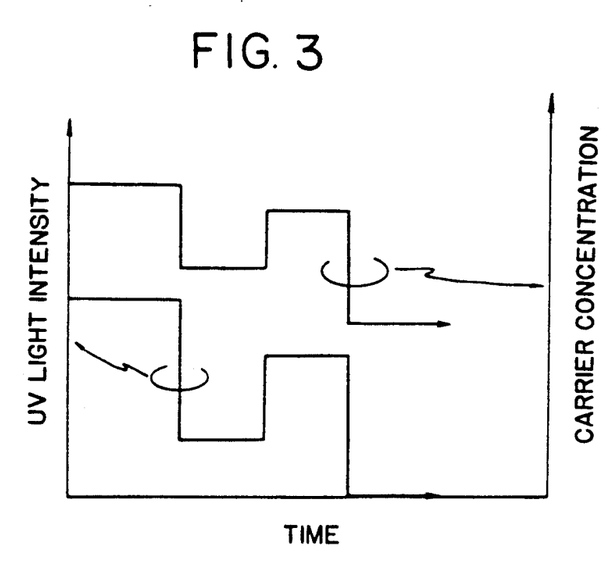
FIG. 3 is a diagram showing doping characteristics according to a method of crystal growing a semiconductor thin film as a second embodiment of the present invention.

A second embodiment of the present invention for growing a semiconductor thin film will be described. Herein, SiH$_4$ is used as a dopant gas as in the first embodiment. The decomposition speed of SiH$_4$ on the substrate or a transition region produced thereon varies dependent on the intensity of the ultraviolet rays. Accordingly, by keeping the flow rate of SiH$_4$ constant and varying the intensity of the ultraviolet light, the carrier concentration in the epitaxial layer can be varied (refer to FIG. 3). The carrier concentration in the epitaxial layer is ordinally controlled by varying the flow rate of dopant. In this method, however, there should be no turbulence in the supply tube and the manifold valve in order to obtain a steep doping profile.

In this embodiment, since the doping rate can be controlled only by varying the light intensity without varying the flow rate of dopant, a steep doping profile can be obtained even in an MOCVD apparatus having a gas supply tube system which is not optimally designed.

Figure 4:
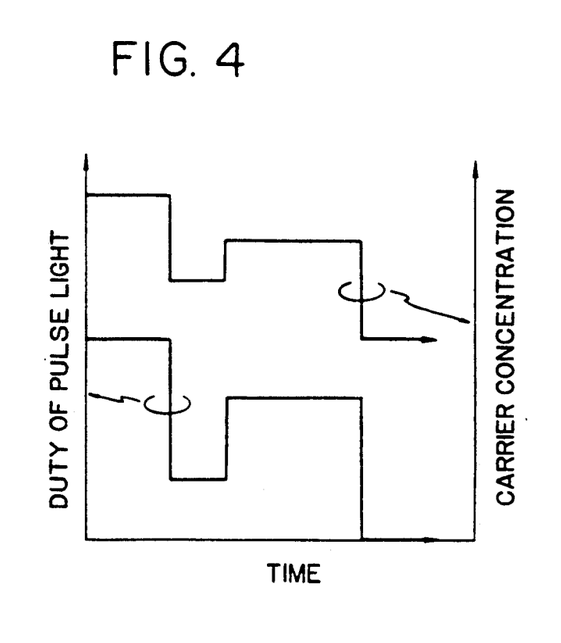
FIG. 4 is a diagram showing doping characteristics according to a third embodiment of the present invention.

A third embodiment of the present invention for growing a semiconductor thin film will be described. In this embodiment, SiH$_4$ is used as a dopant gas as in the first embodiment. When the SiH$_4$ is irradiated with pulses of ultraviolet light, the pulse frequency is above several tens Hz, and the excitation rate of SiH$_4$ is controlled by varying the pulse width so that the carrier concentration can be varied (refer to FIG. 4).

A variety of sources of ultraviolet light may be used. An excimer laser emitting light at a wavelength of 193 nm is optimum in view of light intensity and simplicity. However, since the excimer laser has difficulty in accurately varying its output light intensity in a short time, it is inadequate as a light source in the second embodiment. However, pulsed light can be obtained by modulating the excimer laser with a continuous wave and introducing the laser light into an A/O modulator. Pulsed light at a wavelength of 193 nm having different pulse widths can be easily obtained by varying the pulse width of voltage applied to the A/O modulator. In other words, the doping profile in the epitaxial layer can be controlled by varying the pulse width of voltage applied to the A/O modulator.

A fourth embodiment of the present invention for growing a semiconductor thin film will be described. When epitaxial growth is carried out using group VI material such as Se as a dopant, the carrier concentration and the photoluminescence intensity (hereinafter referred to as "PL intensity") hardly depend on the growth conditions. On the contrary, since Si is an amphoteric impurity in the III-V compound, the carrier concentration varies in accordance with the crystal growth conditions (V/III ratio), and the PL intensity of epitaxial layer greatly depends on the growth conditions. Especially in the case of high doping, deep levels can be easily produced in the substrate. When such deep levels exist, the PL intensity in the crystal is lowered. When a crystal having a low PL intensity is used as laser crystal, the light emission efficiency is unfavorably deteriorated. Therefore, while there arises no problem when the dopant concentration is about $1 \times 10^{18}$ cm$^{-3}$ as usual, the doping level of SiH$_4$ has to be carefully selected when the dopant concentration is above $3 \times 10^{18}$ cm$^{-3}$.

Figure 5:
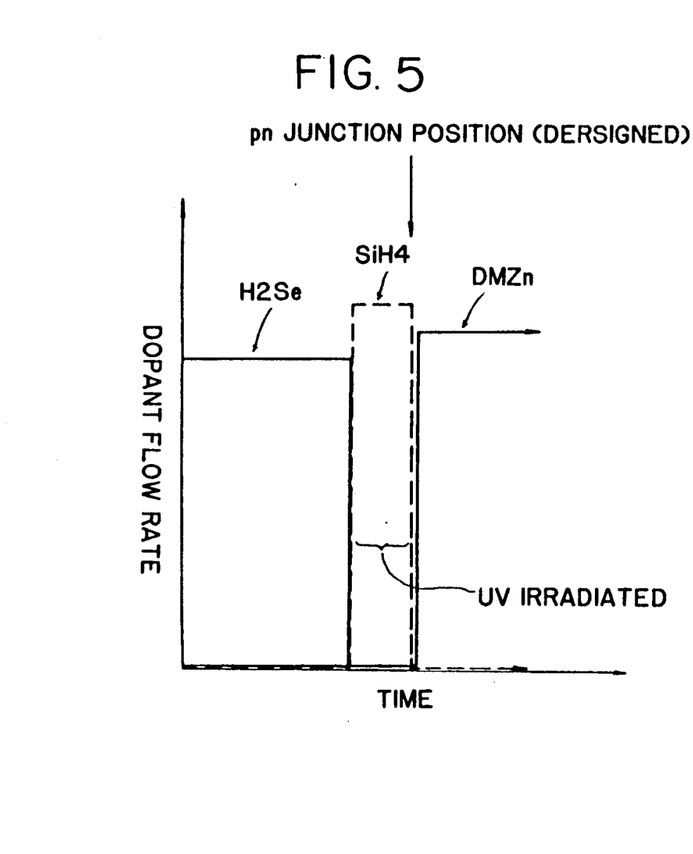
FIG. 5 is a diagram showing a doping profile of a pn junction according to fourth embodiment of the present invention.

However, when H$_2$Se which has less crystal growth condition dependency is used as a doping gas, there may arise the problem that the pn junction position is deviated. Therefore, in view of above-described problems, especially when this embodiment is employed for producing a high light emission efficiency and high power laser device, crystalline thin film growth is carried out using H$_2$Se as the dopant at n side region, from the pn junction. Thereby, an epitaxial layer having a stable optical characteristics, is produced. The n type dopant is switched to SiH$_4$ when the doping reaches the neighborhood of the pn junction. At the same time ultraviolet rays are selectively irradiate only the SiH$_4$. Then, the supply of SiH$_4$ is halted when the growth of the n type layer concludes, and the supply of DMZn, which is the p type dopant gas is started. The flow chart of this growth program is shown in FIG. 5.

Figure 6:
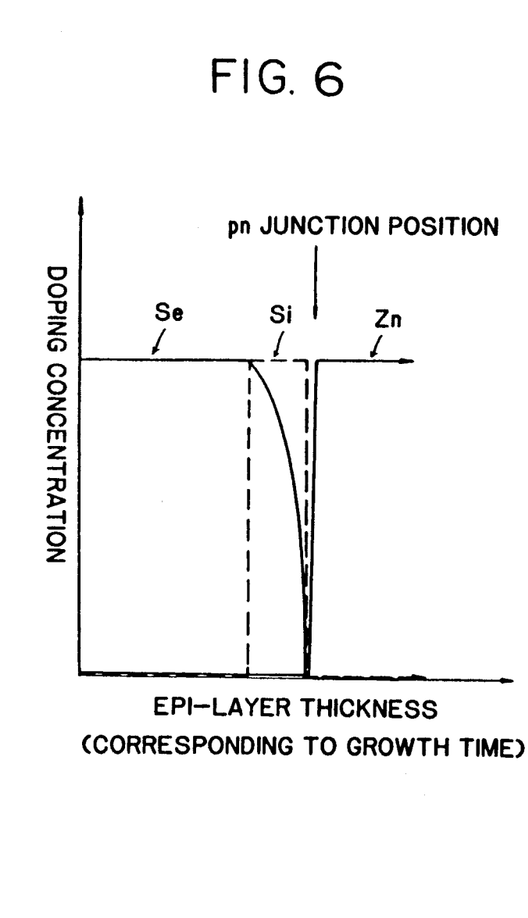
FIG. 6 is a diagram showing a doping profile of a pn junction produced by the fourth embodiment.

The doping concentrations of the respective impurities in the epitaxial layer produced by this method are shown in FIG. 6. When the supply of H$_2$Se gas is halted, the doping by Se slowly decreases due to the memory effect. Meanwhile, the dopant is switched to Si. The doping gas is SiH$_4$, and a dopant concentration that is approximately equal to that obtained by using H$_2$Se is realized by irradiating the SiH$_4$ with ultraviolet rays. When the growth of n type layer concludes, the supply of SiH$_4$ is halted, and then the doping width Si rapidly falls because the SiH$_4$ memory effect is low. Therefore, no remote junction is likely to occur. Furthermore, since the n type layers, except near the pn junction, are doped using Se which is optically stable, the optical characteristics of epitaxial layers are good. As described above, in this embodiment, a highly doped region having a dopant concentration of about $3 \times 10^{18}$ cm$^{-3}$ is produced by doping from H$_2$Se at a region deeper than the pn junction 15, and doping from SiH$_4$ at a dopant concentration of $1 \times 10^{18}$ cm$^{-3}$ in the neighborhood of pn junction 15, thereby producing a pn junction at the design position. This method is quite effective for producing a high power output laser device.

While in the above-described first to fourth embodiments, SiH$_4$ is used as n type doping material whose carrier concentration is regulated by its decomposition speed, organic compounds of Si or GeH$_4$ may also be used.

Figure 7:
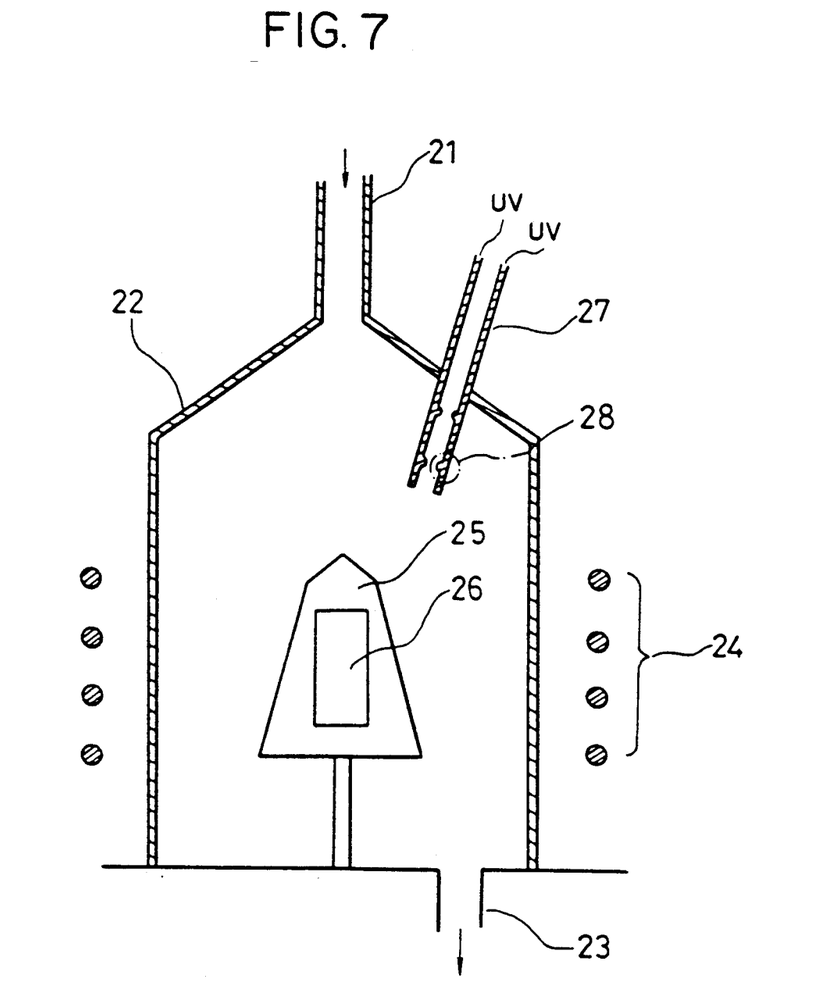
FIG. 7 is a diagram showing a cross-section of an apparatus for growing a crystalline semiconductor thin film according to the present invention.

FIG. 7 shows a crystal growth apparatus for growing semiconductor thin films according to a fifth embodiment of the present invention.

In FIG. 7, reference numeral 22 designates a reaction tube having a gas inlet at the top portion thereof. Alkyl compounds and hydrides gases, doping gases producing carrier concentrations regulated by flow rates, and a carrier gas such as hydrogen are introduced into the reaction tube 22 through the gas inlet 21. A gas outlet 23 for exhausting the gases is provided at the bottom of reaction tube 22. A carbon susceptor 25 for holding and heating a growth wafer 26 is disposed inside the reaction tube 22. RF coils 24 for inductively heating the susceptor 25 are disposed outside and surrounding the reaction tube 22. A dopant inlet 27 is provided for introducing doping gases producing carrier concentrations regulated by decomposition speed into the reaction tube 22. This dopant inlet 27 is a tube and is made of material such as quartz which is transparent to ultraviolet rays, whereby the ultraviolet rays are confined in the dopant inlet 27. A plurality of convex portions 28 are provided at the internal wall of dopant inlet 27 so that the ultraviolet rays leak to the inside of tube 22 at those portions.

In this apparatus, a dopant gas such as SiH$_4$ whose carrier concentration is regulated by its decomposition speed is introduced into the reaction tube 22 through the dopant inlet 27. The SiH$_4$ gas is excited by the ultraviolet rays which leak from the convex portions 28 while being introduced through the dopant inlet 27. This excited SiH$_4$ gas is decomposed on the heated growth wafer 26 at a sufficiently large decomposition speed. Furthermore, in this apparatus, the ultraviolet rays are confined in the transparent material of dopant inlet 27 such as quartz The ultraviolet rays leak to the inside of tube 22 only at the convex portions 28 which are provided at the internal wall of dopant inlet 27. Therefore, the ultraviolet rays selectively irradiate only the SiH$_4$.

While in the above-illustrated embodiment, a plurality of convex portions 28 are provided at the internal wall of dopant inlet 27 so that the ultraviolet rays leak to the inside of reaction tube thereat, concave portions or portions having different refractive indices may be provided with the same effect as described above.

According to the crystalline film growth apparatus of this embodiment, since ultraviolet rays selectively irradiate only SiH$_4$, only the SiH$_4$ can be exited while the source gases such as TMGa are not excited. Therefore, the doping efficiency can be enhanced without causing variation in the growth speed which would occur when the ultraviolet rays irradiate the source gases.

As is evident from the foregoing description, according to a first aspect of the present invention, while doping is conducted using a dopant gas producing a carrier concentration regulated by its decomposition speed in the MOCVD method, ultraviolet rays selectively irradiate only the dopant gas before the dopant gas reaches a substrate or a transition layer produced on the substrate. Therefore, a high dopant concentration and a steep doping profile are realized.

According to a second aspect of the present invention, while ultraviolet rays selectively irradiate only the dopant gas before a dopant gas reaches a substrate or the transition layer produced on the substrate, the light intensity of the ultraviolet rays is controlled without varying the flow rate of the dopant gas, thereby varying the doping profile.

According to a third aspect of the present invention, while ultraviolet rays selectively irradiate only the dopant gas before a dopant gas reaches a substrate or the transition layer disposed on the substrate, pulsed ultraviolet rays having constant peak intensity, and pulse frequency are controlled by the pulse width. Therefore, the pulse width and the pulse frequency are controlled without varying the flow rate of the dopant gas, thereby varying the doping profile.

According to a fourth aspect of the present invention, while a multi-layer semiconductor thin film including a pn junction is grown by an MOCVD method, doping at a region spaced from the pn junction, at least at the n side, is carried out by using a dopant gas producing a carrier concentration regulated by its flow rate, and the doping at the neighborhood of pn junction is achieved using a dopant gas producing a carrier concentration regulated by its decomposition speed. Ultraviolet rays selectively irradiate only the dopant gas before the dopant reaches the substrate or a transition layer disposed on the substrate. Therefore, a multi-layer crystalline semiconductor thin film having stable optical characteristics and having no remote junction can be obtained.

An apparatus for growing a semiconductor thin film of the present invention, includes a first gas inlet for introducing source gases comprising alkyl compounds and hydrides, a doping gas producing carrier concentrations regulated by flow rate, and a carrier gas such as hydrogen into a reaction tube. A second gas inlet introduces a dopant gas producing a carrier concentration regulated by its decomposition speed into the reaction tube. The second gas inlet is a tube made of a material transparent to ultraviolet light such as quartz so that ultraviolet rays are confined to the transparent material. A plurality of convex portions, concave portions, or portions having different refractive indices are provided at the internal wall of second gas inlet so that ultraviolet rays leak to the inside of tube. Therefore, ultraviolet rays selectively irradiate only the dopant gas producing a dopant concentration regulated by its decomposition speed.

What is claimed is:

1. A method of doping a growing crystalline compound semiconductor film comprising growing a crystalline compound semiconductor film by metal organic chemical vapor deposition, doping the growing crystalline compound semiconductor film by decomposing a doping gas to incorporate in the growing crystalline compound semiconductor film a dopant producing a charge carrier concentration regulated by the decomposition speed of the doping gas, and selectively irradiating only the doping gas with ultraviolet light before the doping gas reaches the growing crystalline compound semiconductor film to increase the decomposition speed of the doping gas at the substrate.

2. The doping method of doped claim 1 wherein the doping gas is $SiH_4$.

3. The doping method of doped claim 1 wherein the doping gas is an organic compound of silicon.

4. The doping method of claim 1 wherein the doping gas is $GeH_4$.

5. The doping method of claim 1 including varying the intensity of the ultraviolet light without changing the flow rate of the doping gas to control the charge carrier concentration in the growing crystalline compound semiconductor film.

6. The doping method of claim 1 including irradiating the doping gas with pulsed ultraviolet light of constant peak intensity and controlling the charge carrier concentration in the growing crystalline compound semiconductor film by varying at least one of the pulse width and pulse frequency of the pulsed ultraviolet light.

7. A method of doping a growing compound crystalline semiconductor film including multiple layers and a pn junction comprising:
    growing a crystalline compound semiconductor film including a pn junction by metal organic chemical vapor deposition;
    doping a portion of the growing crystalline compound semiconductor film spaced from and at the n side of the pn junction by decomposing a first doping gas to incorporate in the growing crystalline compound semiconductor film a dopant producing a charge carrier concentration regulated by the flow rate of the first doping gas; and
    doping the growing crystalline compound semiconductor film in the neighborhood of the pn junction by decomposing a second doping gas to incorporate in the growing crystalline compound semiconductor film a dopant producing a charge carrier concentration regulated by the decomposition speed of the second doping gas while selectively irradiating the second doping gas with ultraviolet light before the second doping gas reaches the growing crystalline compound semiconductor film.

8. The doping method of claim 7 wherein the second doping gas is $SiH_4$.

9. The doping method of claim 7 wherein the second doping gas is an organic compound of silicon.

10. The doping method of claim 7 wherein the second doping gas is $GeH_4$.

11. The doping method of claim 7 wherein the first doping gas is $H_2Se$.

12. The doping method of claim 7 including relatively heavily doping said portion spaced from said pn junction to produce a relatively high dopant concentration region and relatively lightly doping in the neighborhood of the pn junction to produce a relatively low dopant concentration region while producing a double heterojunction structure for a semiconductor laser device.

13. The doping method of claim 12 wherein the relatively high dopant concentration region has a dopant impurity concentration of about $4 \times 10^{18}$ cm$^{-3}$ and the relatively low dopant concentration region has a dopant impurity concentration of about $1 \times 10^{18}$ cm$^{-3}$.

* * * * *